US010416194B2

(12) United States Patent
Wu

(10) Patent No.: US 10,416,194 B2
(45) Date of Patent: Sep. 17, 2019

(54) CIRCUIT ADAPTER BOARD

(71) Applicant: Hsin Lung Wu, Taoyuan (TW)

(72) Inventor: Hsin Lung Wu, Taoyuan (TW)

(*) Notice: Subject to any disclaimer, the term of this patent is extended or adjusted under 35 U.S.C. 154(b) by 27 days.

(21) Appl. No.: 15/844,125

(22) Filed: Dec. 15, 2017

(65) Prior Publication Data
US 2019/0187182 A1 Jun. 20, 2019

(51) Int. Cl.
*G01R 31/00* (2006.01)
*G01R 1/073* (2006.01)
*G01R 1/067* (2006.01)
*H05K 1/02* (2006.01)

(52) U.S. Cl.
CPC ..... *G01R 1/07378* (2013.01); *G01R 1/06722* (2013.01); *H05K 1/0298* (2013.01)

(58) Field of Classification Search
None
See application file for complete search history.

(56) References Cited

U.S. PATENT DOCUMENTS

2006/0250149 A1* 11/2006 Lan .................. G01R 1/07378
324/754.03
2012/0306523 A1* 12/2012 Kwon ............... G01R 1/07378
324/755.01

* cited by examiner

*Primary Examiner* — Clayton E. LaBalle
*Assistant Examiner* — Jas A Sanghera
(74) *Attorney, Agent, or Firm* — Sinorica, LLC

(57) ABSTRACT

A circuit adapter board has a film circuit board, a spring probe assembly, a space, and a filler. The film circuit board has a film body and multiple conductors. The film body has multiple first contacts and multiple second contacts. A density of distribution of the second contacts is higher than a density of distribution of the first contacts. The conductors are respectively connected to the first contacts. The spring probe assembly is disposed out of the first outer layer and has a plate and multiple spring probes. The spring probes are respectively disposed in the plate. Each spring probe has a base, a connecting portion, and a contacting portion being retractable. The space is formed between the film body of the film circuit board and the plate. The filler is disposed between the film body and the plate.

4 Claims, 4 Drawing Sheets

CIRCUIT ADAPTER BOARD

BACKGROUND OF THE INVENTION

1. Field of the Invention

The present invention relates to a circuit adapter board, and more particularly to a circuit adapter board to integrate a film circuit board and a spring probe.

2. Description of Related Art

A probe card is applied to test a wafer. A probe head of the probe card has multiple probes distributed in high density for testing at least one or multiple chips of the wafer. The probes distributed in high density are electrically connected to the contacts distributed in low density of a circuit board of the probe card. The probe card further has a circuit adapter assembly for adapting a high density distribution to a low density distribution. The circuit adapter assembly is an electrical connecting medium between the probe head of the probe card and the circuit board.

The circuit adapter assembly has a circuit adapter board and an interposer. The circuit adapter board has a feature of re-routing a circuit. The contacts distributed in high density are disposed at one of two sides of the circuit adapter assembly and are electrically connected to the probes of the probe head. The contacts distributed in low density are disposed at the other one of the two sides of the circuit adapter assembly and are electrically connected to a conductor of the interposer. The probes of the probe head are electrically connected to the contacts of the circuit board by the conductor of the interposer. In a wafer testing operation, the probes of the probe head is a medium for contacting the wafer.

As the above-mentioned description, the circuit adapter assembly is composed of the circuit adapter board and the interposer, and transfers from the high density distribution to the low density distribution. A spacing of the adjacent probes is shorter than a spacing of the adjacent contacts. The probes of the probe head can be connected to the contacts of the circuit board by the circuit adapter assembly for connecting electrically and matching the circuits.

However, in the overall structure of the circuit adapter assembly, the circuit adapter board is a rigid and multilayer printed circuit board. The thickness of the circuit adapter board is too large. The height of the circuit adapter assembly including the independent interposer is too high. A distance between the circuit board of the probe card and the wafer is too long. A signal transmission path between the circuit board and the wafer is too long, too. The impedance of the circuit adapter assembly is too high, and the signal transmission loss of the circuit adapter assembly is too large. The circuit adapter assembly may affect the high-frequency test environment of the wafer adversely.

To overcome the shortcomings, the present invention provides a circuit adapter board to mitigate or obviate the aforementioned problems.

SUMMARY OF THE INVENTION

The objective of the invention is to provide a circuit adapter board to solve the problems that the signal transmission path of the circuit adapter assembly is too long, the impedance of the circuit adapter assembly is too high, and the signal transmission loss of the circuit adapter assembly is too large.

The circuit adapter board has a film circuit board, a spring probe assembly, a space, and a filler. The film circuit board has a film body and multiple conductors. The film body has a first outer layer, a second outer layer, and an inner layer. The first outer layer has an outer surface, an inner surface, and multiple first contacts. The inner surface of the first outer layer is opposite to the outer surface of the first outer layer. The first contacts are disposed in the first outer layer at spaced intervals and exposed out of the outer surface of the first outer layer. The second outer layer is opposite to the first outer layer and has an outer surface, an inner surface, and multiple second contacts. The inner surface of the second outer layer is opposite to the outer surface of the second outer layer and faces the inner surface of the first outer layer.

The second contacts are disposed in the second outer layer at spaced intervals and exposed out of the outer surface of the second outer layer. A density of distribution of the second contacts is larger than a density of distribution of the first contacts. The inner layer is disposed between the first outer layer and the second outer layer, is connected with the inner surface of the first outer layer and the inner surface of the second outer layer, and has multiple wires. The wires are disposed in the inner layer and are connected with the first contacts of the first outer layer and the second contacts of the second outer layer. The conductors are disposed on the first outer layer and are respectively connected to the first contacts of the first outer layer.

The spring probe assembly is disposed out of the first outer layer of the film circuit board. The spring probe assembly has a plate and multiple spring probes. The plate is rigid and insulating and has multiple holes formed through the plate. The spring probes are respectively disposed in the holes of the plate. Each spring probe has a base, a connecting portion, and a contacting portion. The base has two ends. The connecting portion is located at one of the two ends of the base and is welded to a corresponding one of the conductors. The contacting portion is retractable and is located at the other one of the two ends of the base. The space is formed between the film body of the film circuit board and the plate of the spring probe assembly. The filler is solidified and is disposed between the film body of the film circuit board and the plate of the spring probe assembly for filling the space and being fixedly connected with the film circuit board and the spring probe assembly.

The circuit adapter board has the following advantages:

1. Decreasing the whole thickness: The circuit adapter board is applied to electrically connect to a probe head and a circuit board. The circuit adapter board has an effect of transferring the circuit density from high to low. Each probe of the probe head matches the circuit of the circuit board by the circuit adapter board. In the circuit adapter board, the film circuit board is thin. The whole thickness of the circuit adapter board is decreased by the film circuit board.

2. Decreasing the impedance and the signal transmission loss: The circuit adapter board is connected to the probe head to form the probe card. The whole height of the probe card is decreased. A distance between a wafer and the circuit board of the probe card is shortened. The signal transmission path is shortened, too. In a wafer testing operation with the high-frequency test environment, the signal transmission path, the impedance, and the signal transmission loss are decreased for increasing the testing efficiency.

3. The filler is disposed between the film body of the film circuit board and the plate of the spring probe assembly for filling the space and fixing with the film circuit board and the spring probe assembly. The film adapter board is fixed and is supported firmly. The conductors welded between the film circuit board and the spring probe assembly are covered and are fixed by the filler. The film circuit board is flat. The second contacts are electrically connected to the probes of the probe head. Each spring probe of the spring probe assembly is electrically connected to the corresponding one of the conducts of the circuit board. The probe head is electrically connected to the circuit board by the circuit adapter board.

Furthermore, in each spring probe, the connecting portion is a sleeve, and the contacting portion and the base are combined to form a spring probe member. The spring probe is disposed in the plate of the spring probe assembly. The connecting portion is fixed in the corresponding one of the holes of the plate in advance. The spring probe member is detachably disposed in the connecting portion. When the spring probe member is damaged, the damaged spring probe member can be detached from the plate and a new spring probe member can be disposed in the plate. The new spring probe member is combined with the connecting portion. Thus, the replacement of the spring probe is convenient Other objectives, advantages and novel features of the invention will become more apparent from the following detailed description when taken in conjunction with the accompanying drawings.

DETAILED DESCRIPTION OF THE PREFERRED EMBODIMENT

Figure 1:
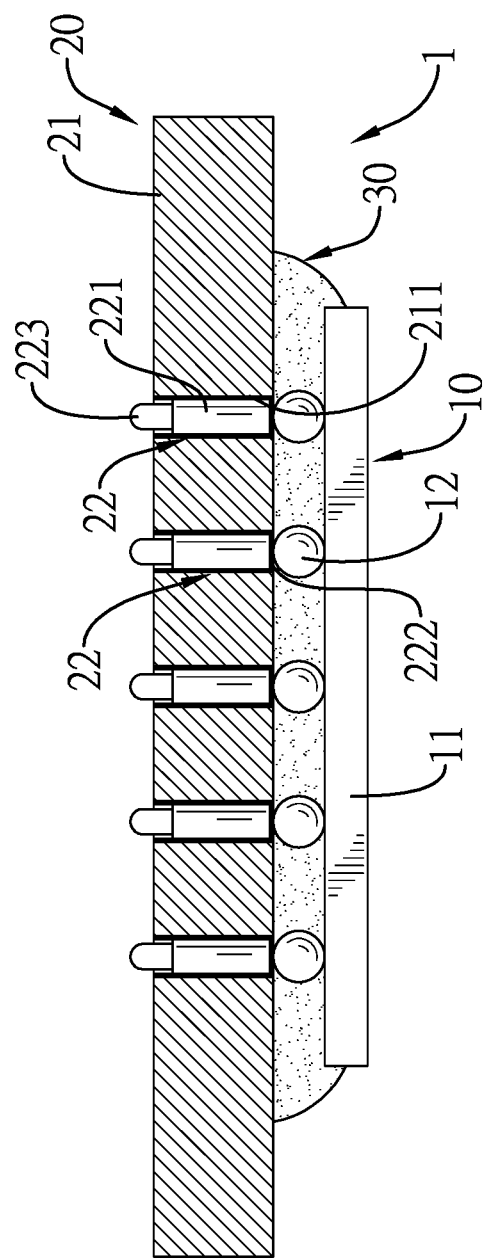
FIG. 1 is a side view in partial section of a first embodiment of a circuit adapter board in accordance with the present invention.

With reference to FIG. 1, a first embodiment of a circuit adapter board 1 in accordance with the present invention comprises a film circuit board 10, a spring probe assembly 20, a space, and a filler 30.

Figure 2:
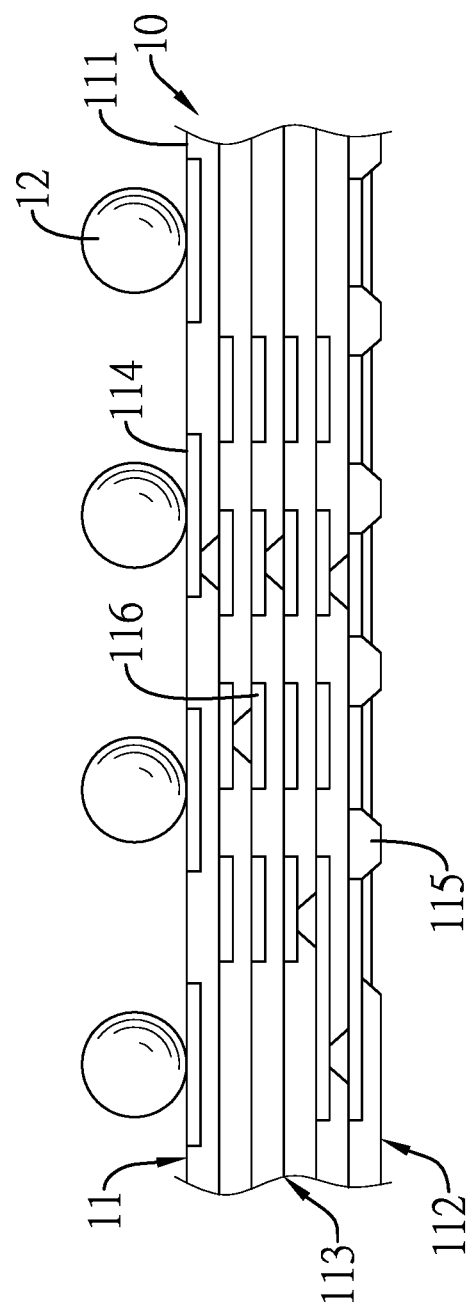
FIG. 2 is a side view of a film circuit board of the circuit adapter board in FIG. 1.

With reference to FIGS. 1 and 2, the film circuit board 10 has a film body 11 and multiple conductors 12. The film body 11 is a slim sheet and has a first outer layer 111, a second outer layer 112, and an inner layer 113. The first outer layer 111 has an outer surface, an inner surface, and multiple first contacts 114. The inner surface of the first outer layer 111 is opposite to the outer surface of the first outer layer 111. The first contacts 114 are disposed in the first outer layer 111 at spaced intervals and exposed out of the outer surface of the first outer layer 111. The second outer layer 112 is opposite to the first outer layer 111 and has an outer surface, an inner surface, and multiple second contacts 115. The inner surface of the second outer layer 112 is opposite to the outer surface of the second outer layer 112 and faces the inner surface of the first outer layer 111. The second contacts 115 are disposed in the second outer layer 112 at spaced intervals and exposed out of the outer surface of the second outer layer 112. A density of distribution of the second contacts 115 is larger than a density of distribution of the first contacts 114.

A spacing between each two adjacent second contacts 115 is shorter than a spacing between each two adjacent first contacts 114. The inner layer 113 is disposed between the first outer layer 111 and the second outer layer 112, is connected with the inner surface of the first outer layer 111 and the inner surface of the second outer layer 112, and has multiple wires 116. The wires 116 are disposed in the inner layer 113 and are connected with the first contacts 114 of the first outer layer 111 and the second contacts 115 of the second outer layer 112. The shorter spacing between each two adjacent second contacts 115 can be transferred to the larger spacing between each two adjacent first contacts 114 by re-routing the wires 116 of the inner layer 113. The conductors 12 are disposed on the first outer layer 111 and are respectively connected to the first contacts 114 of the first outer layer 111. The conductors 12 are conductive particles in ball shape or block shape.

Figure 3:
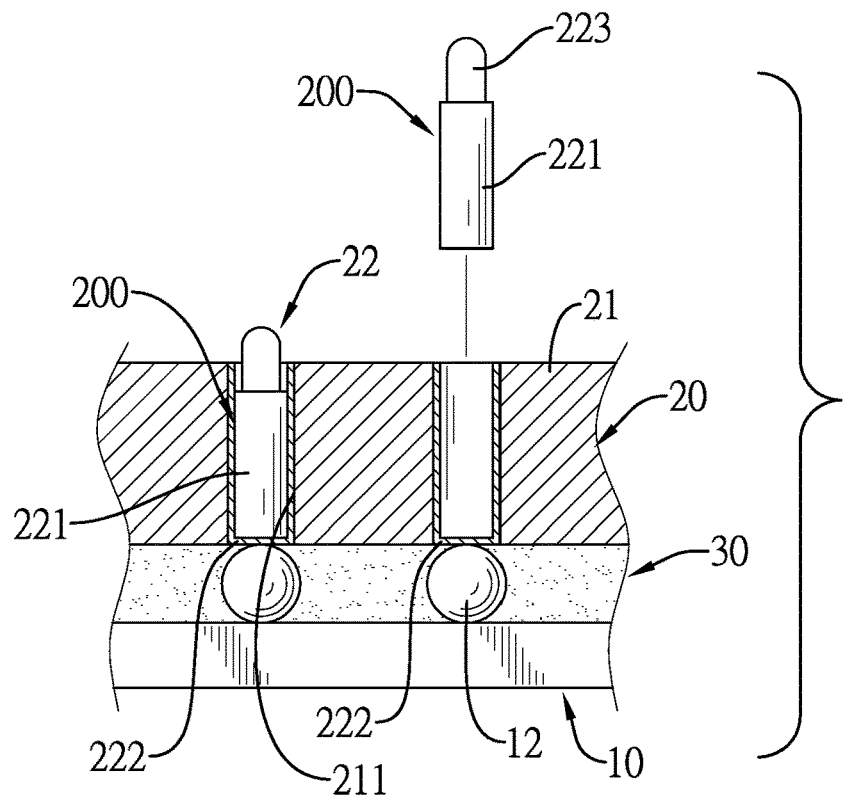
FIG. 3 is an enlarged exploded side view in partial section of the circuit adapter board in FIG. 1.

With reference to FIGS. 1 and 3, the spring probe assembly 20 is disposed out of the first outer layer 111 of the film circuit board 11. The spring probe assembly 20 has a plate 21 and multiple spring probes 22. The plate 21 is rigid and insulating and has multiple holes 211 formed through the plate 21. The spring probes 22 are respectively disposed in the holes 211 of the plate 21. Each spring probe 22 has a base 221, a connecting portion 222, and a contacting portion 223. The base 221 has two ends. The connecting portion 222 is located at one of the two ends of the base 221 and is welded to a corresponding one of the conductors 12. The contacting portion 223 is retractable and is located at the other one of the two ends of the base 221. The spring probes 22 are respectively disposed in the holes 211 of the plate 21 in a tight-fitting way or an adhesive bonding way. The contacting portion 223 can be extended out of an outer surface of the plate 21. In each spring probe 22, the connecting portion 222 is welded to the corresponding one of the conductors 12.

The space is formed between the film body 11 of the film circuit board 10 and the plate 21 of the spring probe assembly 20.

With reference to FIGS. 1 and 3, in each spring probe 22 of the spring probe assembly 20, the connecting portion 222 is a sleeve. The connecting portion 222 has a closed end and an open end opposite to the closed end. The contacting portion 223 and the base 221 are combined to form a spring probe member 200. The connecting portion 222 is detachably disposed on the base 221 in a tight-fitting way or an engaging way. The spring probe 22 is disposed in the plate 21 of the spring probe assembly 20. The connecting portion 222 is fixedly disposed in a corresponding one of the holes 211. The closed end of the connecting portion 222 faces the film circuit board 10 and is welded to the corresponding one of the conductors 12 of the film circuit board 10. The open end of the connecting portion 222 is disposed adjacent to the outer surface of the plate 21. When the spring probe member 200 is damaged, the damaged spring probe member 200 can be detached from the plate 21 of the spring probe assembly 20. A new spring probe member 200 can be disposed on the plate 21.

Figure 4:
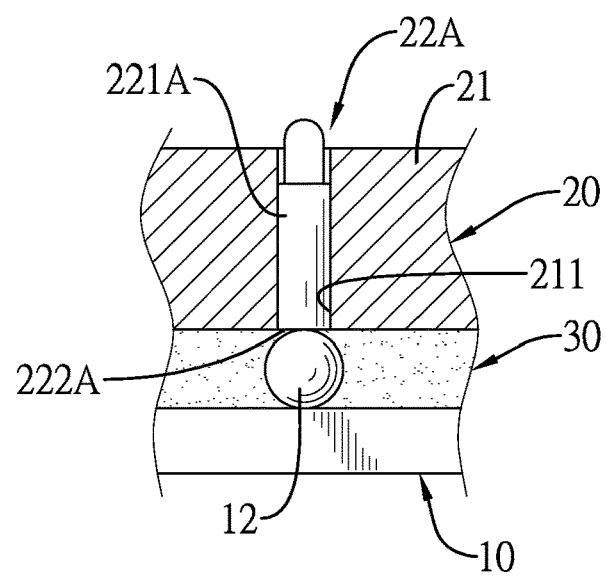
FIG. 4 is an enlarged side view in partial section of a second embodiment of a circuit adapter board in accordance with the present invention.

With reference to FIG. 4, in a second embodiment of the spring probe 22A, the connecting portion 222A is formed on the top end of the base 221A. The connecting portion 222A or the base 221A is fixedly disposed in the corresponding one of the holes 211 of the plate 21 in a tight-fitting way or an adhesive bonding way.

With reference to FIG. 1, the space between the film body 11 of the film circuit board 10 and the plate 21 of the spring probe assembly 20 is filled with the filler 30 in a liquid state. The filler 30 is disposed between the film body 11 of the film circuit board 10 and the plate 21 of the spring probe assembly 20 for filling the space. Then, the filler 30 is solidified and is fixedly connected with the film circuit board 10 and the spring probe assembly 20. The film body 11 of the film circuit board 10 is supported by the filler 30. The film circuit board 10 is flat. The conductors 12 are covered by the filler 30 and then are fixed between the film body 11 and the plate 21 of the spring probe assembly 20. The conductors 12 are steadily located between the film body 11 and the spring probe assembly 20 and are electrically connected to the film body 11 and the spring probe assembly 20.

Figure 5:
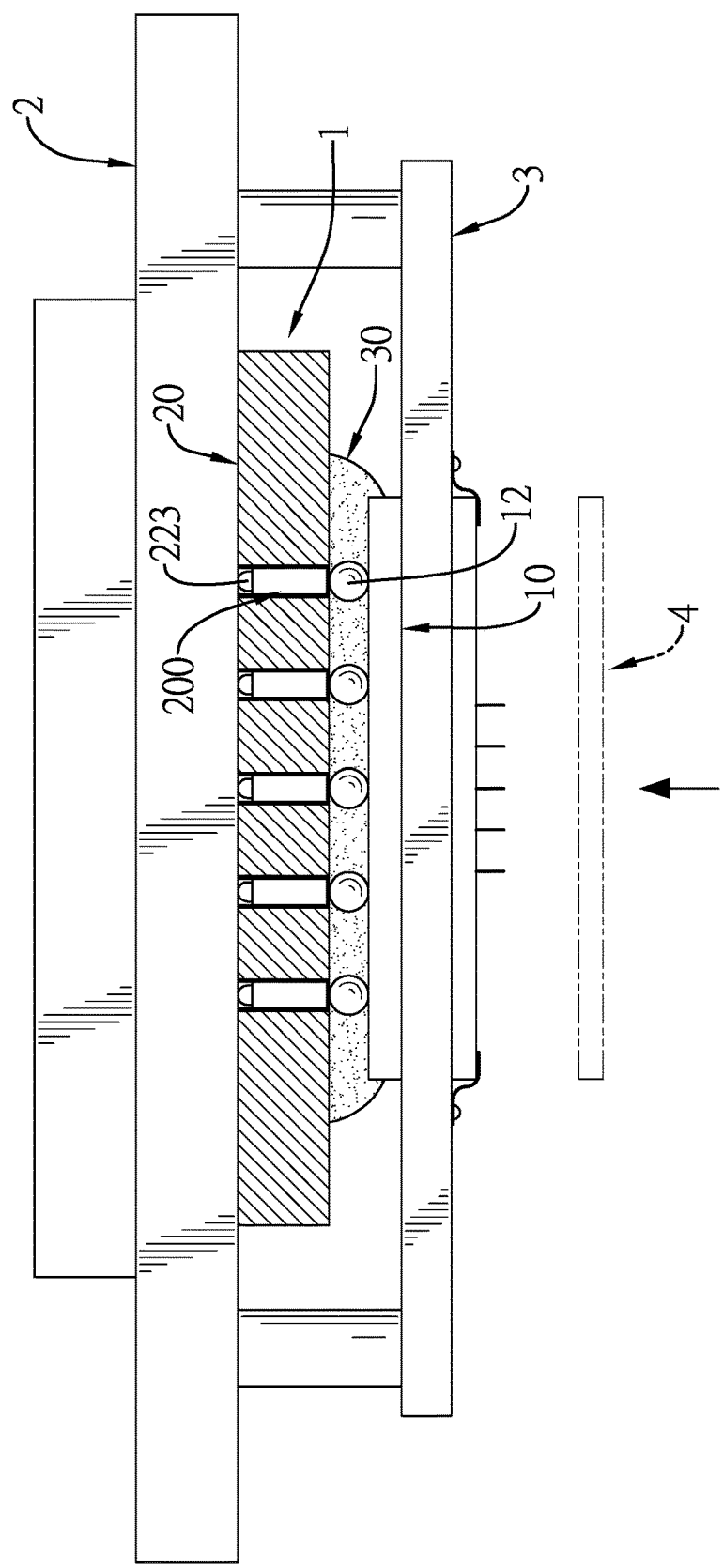
FIG. 5 is an operational side view of the circuit adapter board in FIG. 1.

The circuit adapter board 1 is applied to test a probe card. With reference to FIGS. 1 and 5, the circuit adapter board 1 is combined to a probe head 3 having multiple probes. The spring probe assembly 20 is electrically connected to a circuit board 2. The probes of the probe head 3 are the electrical connecting media for electrically connecting to a wafer 4. The circuit adapter board 1 is fixed on a bottom surface of the circuit board 2 by screws inserted into the probe head 3. The second contacts 115 of the second layer 112 are electrically connected to the probes of the probe head 3. The contacting portions 223 of the spring probe 22 of the spring probe assembly 20 are connected to the contacts of the circuit board 2. Each probe of the probe head 3 is electrically connected to the circuit board 2 by the circuit adapter board 1. The wafer 4 can be tested in a wafer system by the circuit board 2, the circuit adapter board 1, and the probe head 3.

The film circuit board 10 is combined with the spring probe assembly 20 by the filler 30. The first contacts 114 are weldedly connected to the connecting portions 222 of the spring probes 22 of the spring probe assembly 20 by the conductors 12. The filler 30 is disposed between the film body 11 of the film circuit board 10 and the plate 21 of the spring probe assembly 20 for filling the space and being solidified and fixedly connected with the film circuit board 10 and the spring probe assembly 20. The film circuit board 10 is flattened by the filler 30. The circuit adapter board 1 is applied to the probe card. The spring probe members 200 of the spring probe assembly 20 are directly connected to a circuit board 2 of the probe card having a low density. The circuit adapter board 1 can be used to transfer between the circuit board 2 of the low-density probe card and the high-density probe head 3 without an interposer.

The circuit adapter board 1 can be combined to the probe head 3 to form the probe card for decreasing a whole height of the probe card, shortening a distance between the wafer 4 and the circuit board 2 of the probe card, and shortening a signal transmission path. In the wafer testing operation with the high-frequency test environment, the signal transmission path, the impedance, and the signal transmission loss are decreased for increasing the testing efficiency.

What is claimed is:

1. A circuit adapter board comprising:
   a film circuit board having
      a film body having
         a first outer layer having
            an outer surface;
            an inner surface opposite to the outer surface of the first outer layer; and
            multiple first contacts disposed in the first outer layer at spaced intervals and exposed out of the outer surface of the first outer layer;
         a second outer layer opposite to the first outer layer, and having
            an outer surface;
            an inner surface opposite to the outer surface of the second outer layer and facing the inner surface of the first outer layer; and
            multiple second contacts disposed in the second outer layer at spaced intervals and exposed out of the outer surface of the second outer layer, and a density of distribution of the second contacts being higher than a density of distribution of the first contacts; and
         an inner layer disposed between the first outer layer and the second outer layer, connected with the inner surface of the first outer layer and the inner surface of the second outer layer, and having
            multiple wires disposed in the inner layer and connected with the first contacts of the first outer layer and the second contacts of the second outer layer; and
      multiple conductors disposed on the first outer layer and respectively connected to the first contacts of the first outer layer;
   a spring probe assembly disposed out of the first outer layer of the film circuit board, and having
      a plate being rigid and insulating and having multiple holes formed through the plate; and
      multiple spring probes respectively disposed in the holes of the plate, and each spring probe having
         a base having two ends;
         a connecting portion located at one of the two ends of the base and welded to a corresponding one of the conductors; and
         a contacting portion being retractable and located at the other one of the two ends of the base;
   a space formed between the film body of the film circuit board and the plate of the spring probe assembly; and
   a filler solidified and disposed between the film body of the film circuit board and the plate of the spring probe assembly for filling the space and being fixedly connected with the film circuit board and the spring probe assembly.

2. The circuit adapter board as claimed in claim 1, wherein in each spring probe, the connecting portion is a sleeve, the contacting portion and the base are combined to form a spring probe member, the connecting portion has a closed end and an open end opposite to the closed end, the connecting portion is fixedly disposed in a corresponding one of the holes of the plate, the closed end of the connecting portion is welded to a corresponding one of the conductors, and the base in the spring probe member is detachably disposed in the connecting portion.

3. The circuit adapter board as claimed in claim 1, wherein in each spring probe, the connecting portion is formed on a top end of the base, and the connecting portion is fixedly disposed in a corresponding one of the holes of the plate.

4. The circuit adapter board as claimed in claim 1, wherein in each spring probe, the connecting portion is formed on a top end of the base, and the base is fixedly disposed in a corresponding one of the holes of the plate.

* * * * *